United States Patent
Kang (10) Patent No.: US 7,038,938 B2
(45) Date of Patent: May 2, 2006

(54) PHASE CHANGE RESISTOR CELL AND NONVOLATILE MEMORY DEVICE USING THE SAME

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 94 days.

(21) Appl. No.: 10/879,140

(22) Filed: Jun. 30, 2004

(65) Prior Publication Data

US 2005/0128791 A1    Jun. 16, 2005

(30) Foreign Application Priority Data

Dec. 13, 2003   (KR) ...................... 10-2003-0090960

(51) Int. Cl.
*G11C 11/00* (2006.01)

(52) U.S. Cl. ................ 365/154; 365/145; 365/189.01; 365/148

(58) Field of Classification Search ................ 365/154
See application file for complete search history.

(56) References Cited

U.S. PATENT DOCUMENTS

| | | | |
|---|---|---|---|
| 6,574,129 B1* | 6/2003 | Tran | 365/94 |
| 6,847,543 B1* | 1/2005 | Toyoda et al. | 365/154 |
| 6,937,507 B1* | 8/2005 | Chen | 365/163 |
| 6,944,050 B1* | 9/2005 | Kang et al. | 365/158 |

* cited by examiner

*Primary Examiner*—Amir Zarabian
*Assistant Examiner*—Kretelia Graham
(74) *Attorney, Agent, or Firm*—Heller Ehrman LLP (57) ABSTRACT

A nonvolatile memory device features a phase change resistor cell. More specifically, a phase change resistor and a hybrid switch which does not require an additional gate control signal are used to embody rapid nonvolatile SRAM characteristics. In the nonvolatile memory device, a cell plate is connected to a top electrode of a nonvolatile resistor memory device whose resistance state is changed by current values, and the hybrid switch is connected between a flip-flop and a bottom electrode of the nonvolatile resistor memory device, thereby improving characteristics of the rapid nonvolatile memory.

22 Claims, 14 Drawing Sheets

PHASE CHANGE RESISTOR CELL AND NONVOLATILE MEMORY DEVICE USING THE SAME

BACKGROUND OF THE INVENTION

1. Field of the Invention

The present invention generally relates to a phase change resistor cell and a nonvolatile memory device using the same, and more specifically, to a nonvolatile static random access memory (hereinafter, referred to as "SRAM") comprising a phase change resistor and a hybrid switch which does not require an additional gate control signal.

2. Description of the Prior Art

In general, nonvolatile memories such as a magnetic memory and a phase change memory (hereinafter, referred to as "PCM") has a data processing speed as fast as a volatile Random Access Memory (hereinafter, referred to as "RAM") and conserves data even after the power is turned off.

FIGS. 1a to 1d are diagrams illustrating a conventional phase change resistor 4 (hereinafter, referred to as "PCR").

Figure 1A:
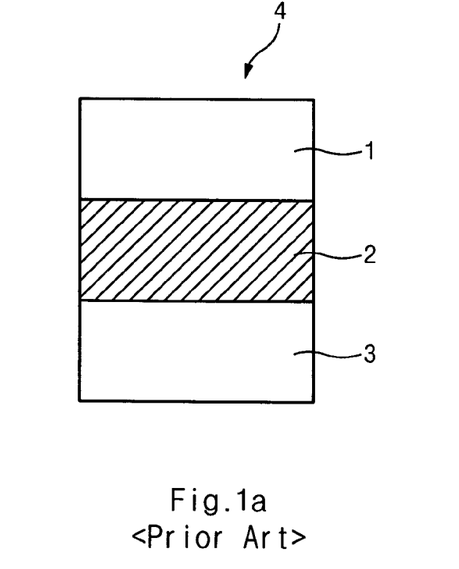
FIGS. 1a to 1d are diagrams illustrating a conventional phase change resistor.
Figure 1B:
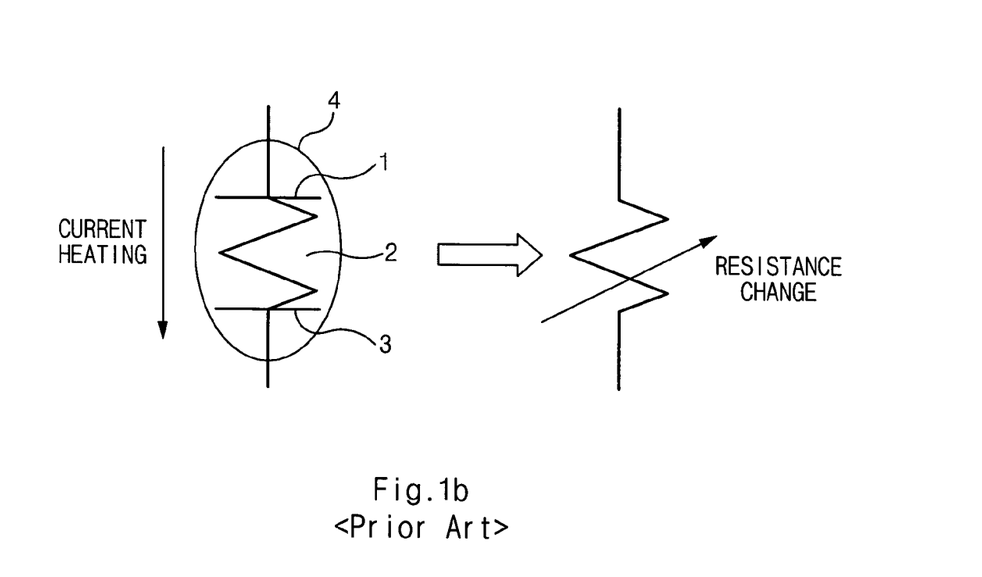

The PCR 4 comprises a top electrode 1, a bottom electrode 3 and a PCM (Phase Change Material) 2 inserted therebetween. If a voltage or current is applied to the PCR 4, the PCM 2 reaches a high temperature state. As a result, resistance is changed, and then an electric conduction state is also changed. Here, AgInSbTe has been widely used as the PCM 2.

Figure 1C:
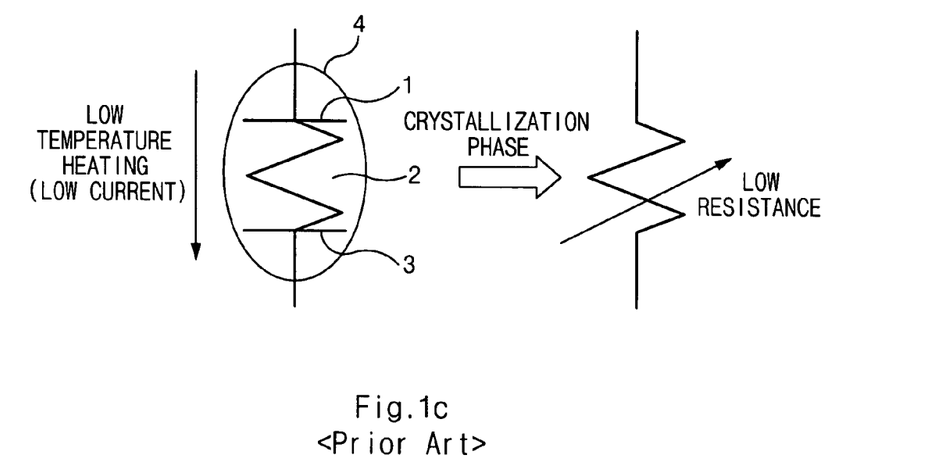

As shown in FIG. 1c, if low current having less than a threshold value flows in the PCR 4, the PCM 2 is heated to a proper temperature for crystallization. As a result, the PCM 2 is changed into a crystalline phase, and the PCR 4 reaches a low resistance state.

Figure 1D:
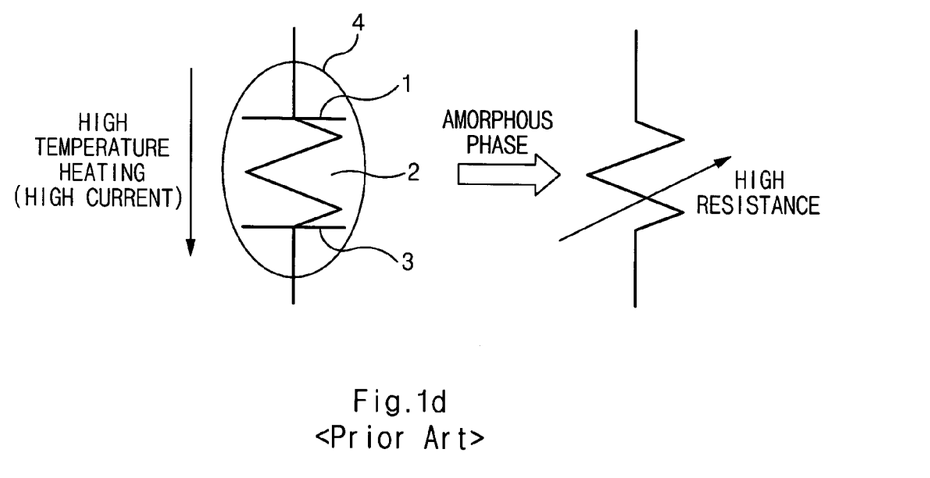

On the other hand, as shown in FIG. 1d, if high current having more than the threshold value flows in the PCR 4, the PCM 2 is heated at a temperature of over a melting point. AS a result, the PCM 2 is changed into an amorphous phase, and reaches a high resistance state.

As described above, the PCR 4 can store data corresponding to the states of two resistances as nonvolatile sates. In other words, if the low resistance state of the PCR 4 refers to data "1" and the high resistance state of the PCR 4 refers to data "0", the PCR 4 can store logic values of the two data.

As a result, a nonvolatile memory device of high performance has been required with a high-speed SRAM having rapid memory operation characteristics, a phase change resistor having the above-described nonvolatile characteristics and a hybrid switch which does not require an additional gate control signal.

SUMMARY OF THE INVENTION

It is a first object of the present invention to provide a high-speed SRAM having rapid memory operation characteristics with a phase change resistor and a hybrid switch which does not require an additional gate control signal.

It is a second object of the present invention to reduce the whole size of a nonvolatile ferroelectric memory by embodying a cross-point cell with a hybrid switch which does not require an additional gate control signal.

It is a third object of the present invention to improve operating characteristics of a memory cell by effectively driving read/write operations in a cell array comprising the phase change resistor and the hybrid switch.

In an embodiment, a phase change resistor cell comprises a plurality of phase change resistors, a plurality of hybrid switches and a storage means. Each of the phase change resistors stores a logic data value corresponding to a resistance sate changed by a crystallization state of a phase change material depending on the amount of current supplied from a word line. Each of the hybrid switches is connected between the phase change resistor and a bit line, and selectively switched depending on a voltage applied to the word line and the bit line. The storage means, which is connected to the plurality of hybrid switches, stores different nonvolatile data through input/output terminals.

In an embodiment, a nonvolatile memory device using a phase change resistor cell comprises a plurality of phase change resistor cell arrays and a plurality of sense amplifiers. Each of the plurality of phase change resistor cell arrays comprises a plurality of unit phase change resistor cells arranged in row and column directions. The plurality of sense amplifiers sense and amplify data applied from the plurality of phase change resistor cell arrays. Here, the unit phase change resistor cell comprises a plurality of phase change resistors for storing at least one or more of data corresponding to a crystallization state changed by current applied from a cell plate line; a plurality of hybrid switch connected one by one to the plurality of phase change resistors, and selectively switched depending on a voltage applied to the cell plate line and a bit line; and storage means connected to the plurality of hybrid switches, for storing different nonvolatile data through input/output terminals.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 2:
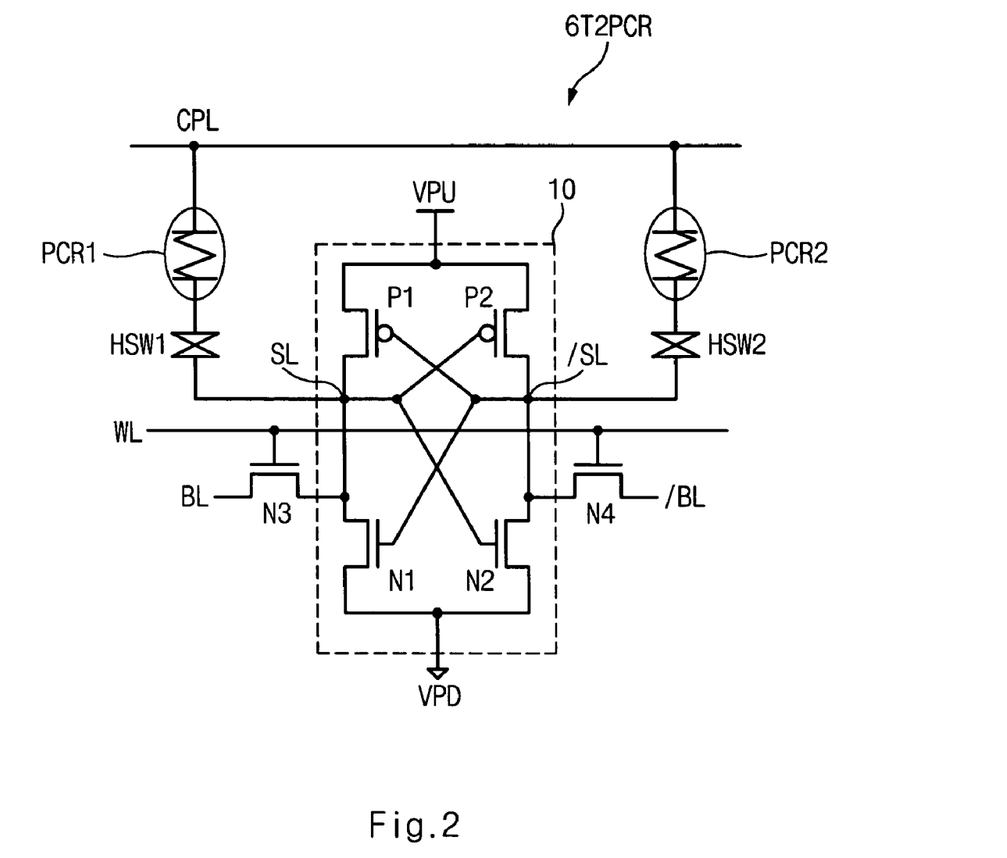
FIG. 2 is a circuit diagram of a phase change resistor cell according to an embodiment of the present invention.

FIG. 2 is a circuit diagram of a phase change resistor cell according to an embodiment of the present invention.

In an embodiment, a PCR cell comprises a phase change resistors PCR1 and PCR2, hybrid switches HSW1 and HSW2, a flip-flop unit 10, and access regulating unit (NMOS transistors N3 and N4).

The phase change resistor PCR1, which has a top electrode connected to a cell plate line CPL and a bottom electrode connected to a hybrid switch HSW1, stores nonvolatile data. The phase change resistor PCR2, which has a top electrode connected to the cell plate line CPL and a bottom electrode connected to the hybrid switch HSW2, stores nonvolatile data. Here, one of the phase change resistors PCR1 and PCR2 is used as large resistance, and the other is used as small resistance.

The hybrid switch HSW1 is connected between the phase change resistor PCR1 and a node SL, and the hybrid switch HSW2 is connected between the phase change resistor PCR2 and a node /SL.

The flip-flop unit 10, which comprises a PMOS latch and a NMOS latch, stores nonvolatile data in the node SL and the opposite nonvolatile data in the node /SL.

Here, the PMOS latch comprises cross-coupled PMOS transistors P1 and P2 which are positioned between a power voltage terminal VPU and the nodes SL and /SL, respectively. The NMOS latch comprises cross-coupled NMOS transistors N1 and N2 which are positioned between a ground voltage terminal VPD and the nodes SL and /SL, respectively. A random control voltage may be applied to the power voltage terminal VPU and the ground voltage terminal VPD by selection of a user.

The access regulating unit comprises NMOS transistors N3 and N4 for controlling connection of the flip-flop unit 10 and the bit lines BL and /BL depending on an enable state of a word line WL. Here, the NMOS transistor N3, connected between the bit line BL and the node SL, has a gate connected to the word line WL. The NMOS transistor N4, connected between the bit line /BL and the node /SL, has a gate connected to the word line WL.

The example of FIG. 2 comprises six transistors P1, P2, N1~N4 and two phase change resistors PCR1 and PCR2 to have a 6T2PCR structure.

Figure 3:
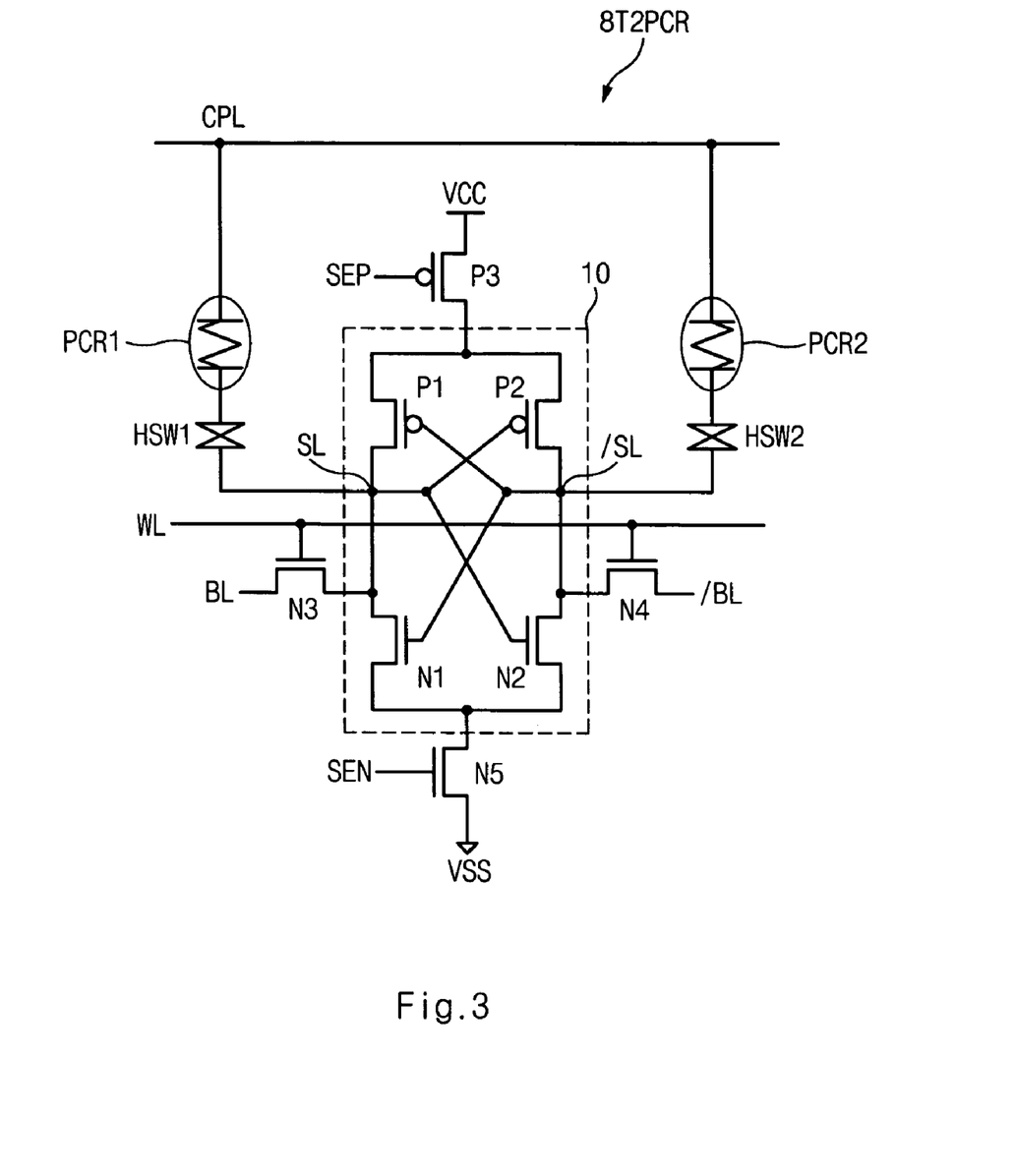
FIG. 3 is a diagram illustrating another example of the phase change resistor cell according to an embodiment of the present invention.

FIG. 3 is a diagram illustrating another example of the phase change resistor cell according to an embodiment of the present invention.

The example of FIG. 3 further comprises a PMOS transistor P3 and a NMOS transistor N5 in comparison with that of FIG. 2. Since the other configuration of FIG. 3 is the same as that of FIG. 2, its detailed explanation is omitted.

The PMOS transistor P3, connected between a power voltage terminal VCC and the flip-flop unit 10, has a gate to receive a sense amplifier enable signal SEP. The NMOS transistor N5, connected between the flip-flop unit 10 and a ground voltage terminal VSS, has a gate to receive a sense amplifier enable signal SEN. Here, the sense amplifier enable signal SEP has an opposite phase to that of the sense amplifier enable signal SEN.

The example of FIG. 3 comprises eight transistors P1~P3 and N1~N5, and two phase change resistors PCR1 and PCR2 to have a 8T2PCR structure. The example of FIG. 3 further comprises the PMOS transistor P3 and the NMOS transistor N5 whose operations are controlled by the sense amplifier enable signals SEP and SEN. As a result, the PCR cell is not interfered by a power applied to an external adjacent circuit by controlling a voltage supplied to the flip-flop unit 10 in response to the control signals.

Figure 4:
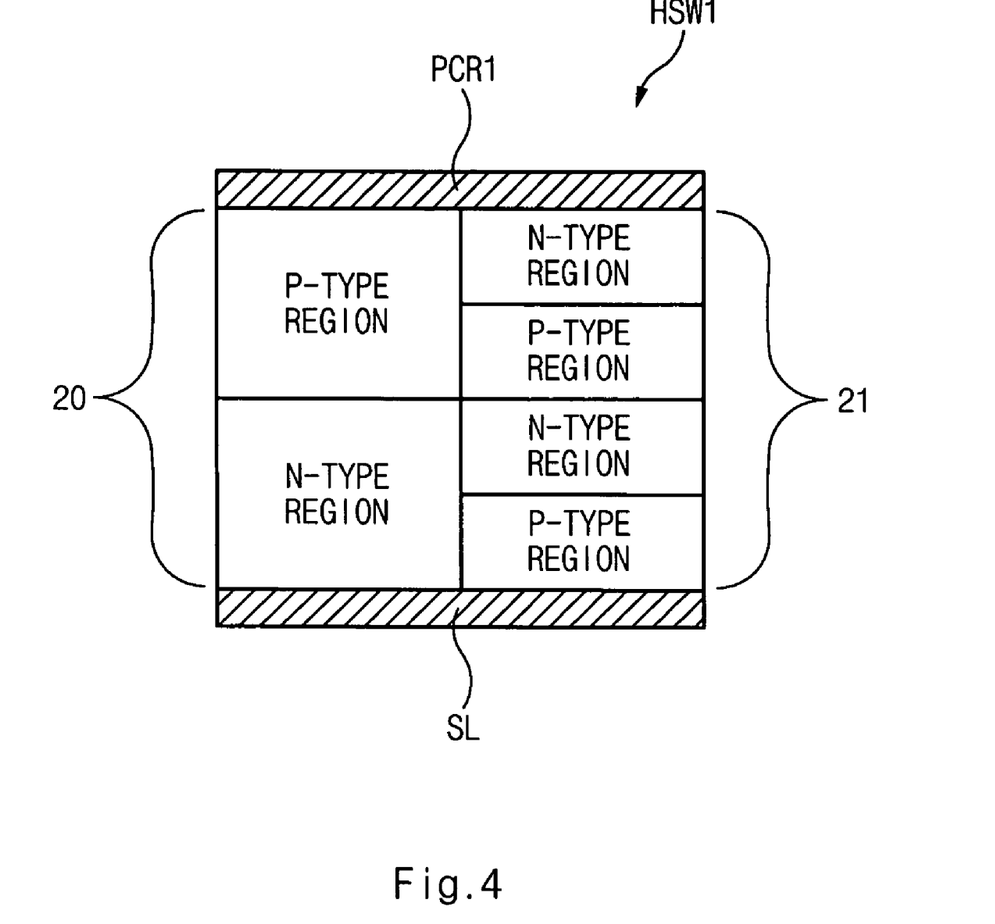
FIG. 4 is a cross-sectional diagram of a hybrid switch of FIGS. 2 and 3.

FIG. 4 is a cross-sectional diagram of the hybrid switch. The hybrid switch HSW1 is exemplified because it has the same configuration as that of the hybrid switch HSW2.

The hybrid switch HSW1 comprises a PN diode switch 20 and a PNPN diode switch 21 which are connected in parallel between the node SL and the bottom electrode of the phase change resistor PCR1.

Here, the PN diode switch 20 comprises a P-type region deposited on a N-type region. The P-type region of the PN diode switch 20 is connected to the bottom electrode of the phase change resistor PCR1, and the N-type region of the PN diode switch 20 is connected to the node SL.

The PNPN diode switch 21 has a sequentially deposited structure of P-type regions and N-type regions. Specifically, in the PNPN diode switch 21, a N-type region is deposited on a lower P-type region, a P-type region is deposited on the N-type region, and then an upper N-type region is deposited on the P-type region. The upper N-type region of the PNPN diode switch 21 is connected to the bottom electrode of the phase change resistor PCR1, and the lower P-type region of the PNPN diode switch 21 is connected to the node SL.

The above-described hybrid switch HSW is represented by a symbol as shown in FIGS. 2 and 3.

Figure 5:
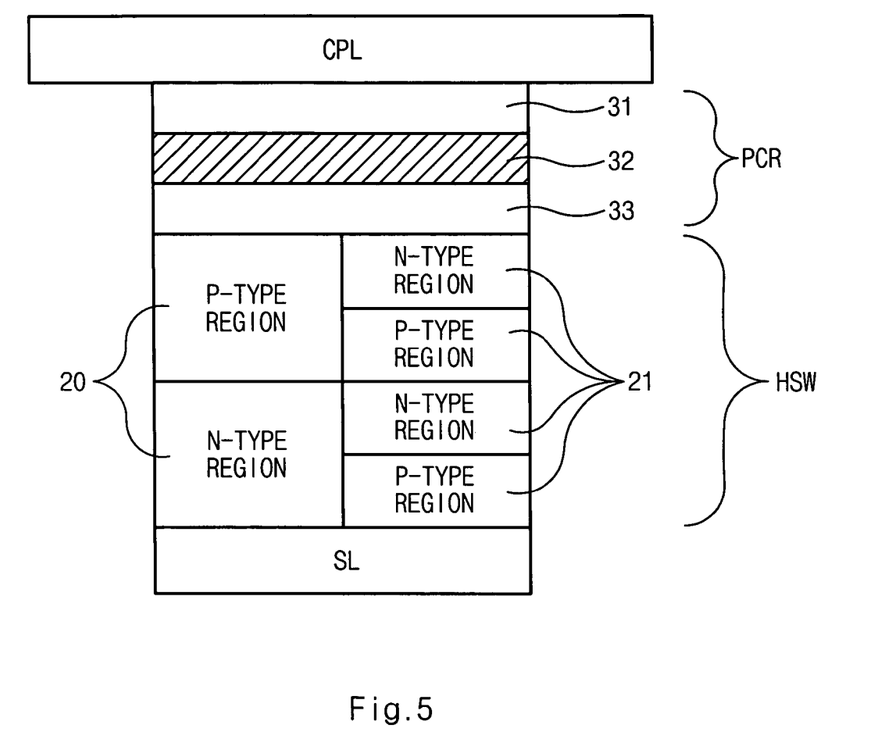
FIG. 5 is a cross-sectional diagram of a phase change resistor cell according to an embodiment of the present invention.

FIG. 5 is a cross-sectional diagram of a phase change resistor cell according to an embodiment of the present invention.

The hybrid switch HSW is deposited on the node SL of the flip-flop unit 10. Then, the phase change resistor PCR is deposited on the hybrid switch HSW. A cell plate line CPL is connected to the upper portion of the phase change resistor PCR Here, the phase change resistor PCR comprises a top electrode 31, a phase change material (hereinafter, referred to as "PCM") 32 and a bottom electrode 33. The top electrode 31 of the phase change resistor PCR is connected to the cell plate line CPL, and the bottom electrode 33 is connected to the P-type region of the PN diode switch 20 and the upper N-type region of the PNPN diode switch 21.

The node SL is connected to the N-type region of the PN diode switch 20 and the lower P-type region of the PNPN diode switch 21.

Figure 6:
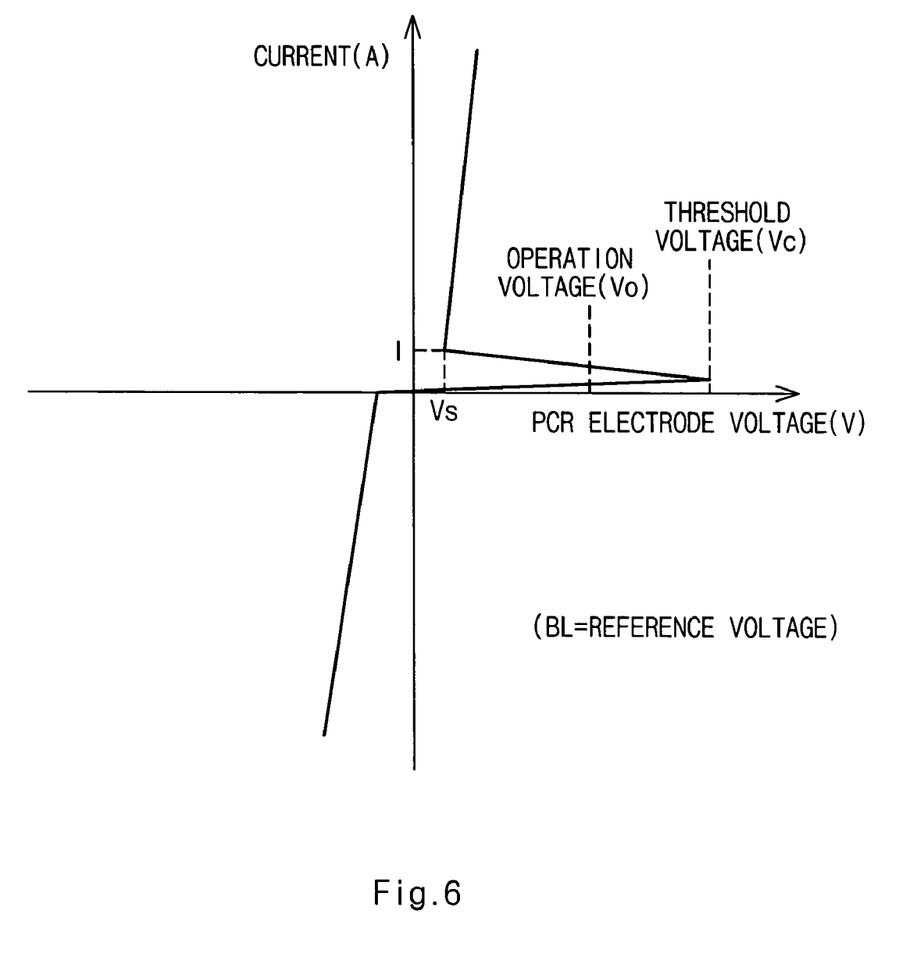
FIG. 6 is a diagram illustrating the operation of the hybrid switch of FIGS. 2 and 3.

FIG. 6 is a diagram illustrating the operation of the hybrid switch of FIGS. 2 and 3.

Supposed that a voltage applied to the PCR increases in a positive direction on a basis of the bit line BL. Here, the hybrid switch HSW is kept off at an operation voltage Vo by the operation characteristic of the PNPN diode switch 21 so that current does not flow.

Thereafter, if the voltage applied to the PCR more increases and reaches a threshold voltage Vc, the PNPN diode switch 21 of the hybrid switch HSW is turned on depending on the forward operation characteristic of the diode. As a result, the amount of current remarkably increases. Here, when the voltage applied to the PCR is over the threshold voltage Vc, a value of current I is affected by resistance (not shown) connected to the PCR to serve as load.

After the PNPN diode switch 21 is turned on, the large amount of current can flow although a small voltage Vs is applied to the PCR. Here, the PN diode switch 20 is kept off by the reverse operation characteristic.

On the other hand, suppose that the voltage applied to the PCR increases toward a negative direction on the basis of the bit line BL. That is, when a predetermined voltage is applied to the cell plate line CPL, the hybrid switch HSW is turned on by the forward operation characteristics of the PN diode switch 20. Then, current flows at a random operation voltage state. Here, the PNPN diode switch 21 is kept off by the reverse operation characteristic.

Figure 7:
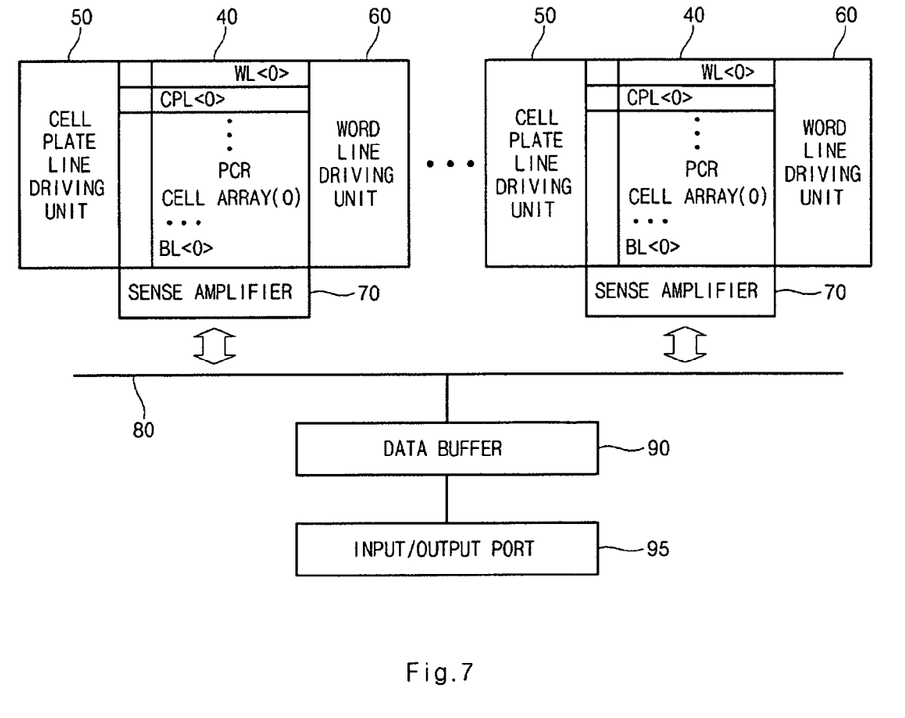
FIG. 7 is a diagram of a nonvolatile memory device using a phase change resistor cell according to an embodiment of the present invention.

FIG. 7 is a diagram of a nonvolatile memory device using a phase change resistor cell according to an embodiment of the present invention.

In an embodiment, the nonvolatile memory device comprises a plurality of PCR cell arrays 40, a plurality of cell plate line driving units 50, a plurality of word line driving units 60, a plurality of sense amplifiers 70, a data bus 80, a data buffer 90 and an input/output port 95.

Each PCR cell array 40 comprises a plurality of unit PCR cells arranged in row and column directions as described in FIG. 2 or 3. A plurality of cell plate lines CPL arranged in the row direction are connected to the cell plate line driving unit 50. A plurality of word lines WL arranged in the row direction are connected to the word line driving unit 60. A plurality of bit lines BL arranged in the column direction are connected to the sense amplifier 70.

Here, one PCR cell array 40 are correspondingly connected to one cell plate line driving unit 50, one word line driving unit 60 and one sense amplifier 70.

The plurality of sense amplifiers 70 share one data bus 80. The data bus 80 is connected to the data buffer 90. The data buffer 90 buffers the amplified data applied from the sense amplifier 70. The input/output port 95 outputs output data applied from the data buffer 90 to the outside or applies input data applied from the outside to the data buffer 90.

Figure 8:
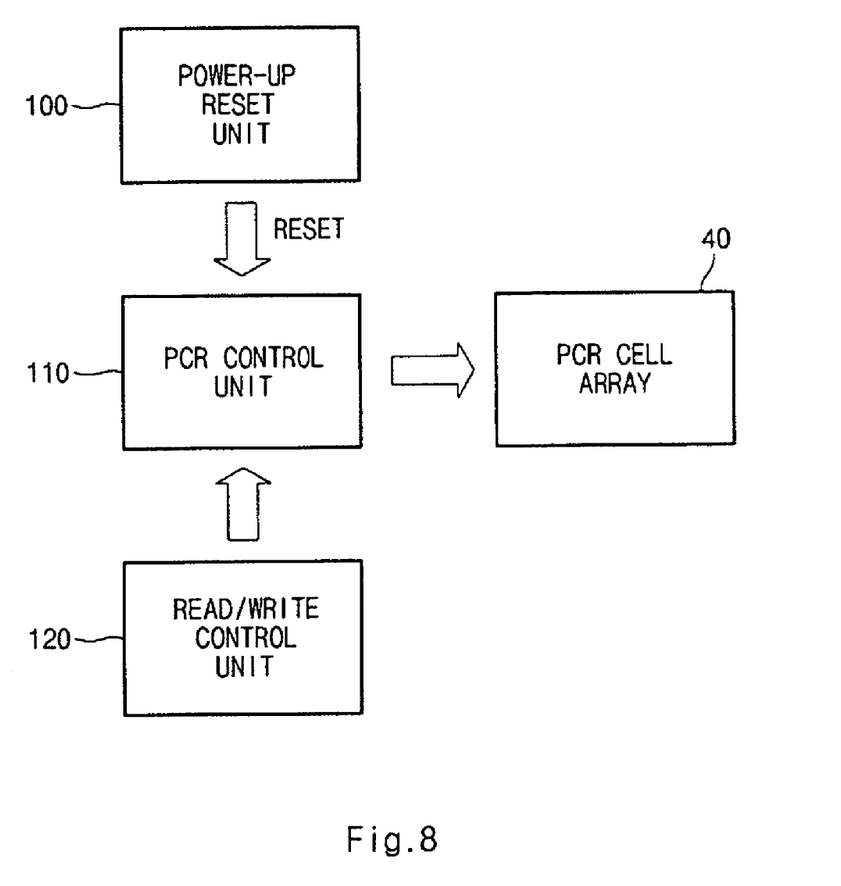
FIG. 8 is a diagram illustrating the whole system of the nonvolatile memory device using a phase change resistor cell according to an embodiment of the present invention.

FIG. 8 is a diagram illustrating the whole system of the nonvolatile memory device using a phase change resistor cell according to an embodiment of the present invention.

In an embodiment, the nonvolatile memory device comprises a power-up reset unit 100, a PCR control unit 110, a read/write control unit 120, and a PCR cell array 40.

The power-up reset unit 100 outputs a reset signal RESET for initializing the PCR cell array 40 to the PCR control unit 110. The read/write control unit 120 outputs basic waveforms of various control signals for reading/writing data in the PCR cell array 40 to the PCR control unit 110.

The PCR control unit 110 controls read/write operations of the PCR cell array 40 in response to the reset signal RESET applied from the power-up control unit 100 and various control signals applied from the read/write control unit 120.

Figure 9:
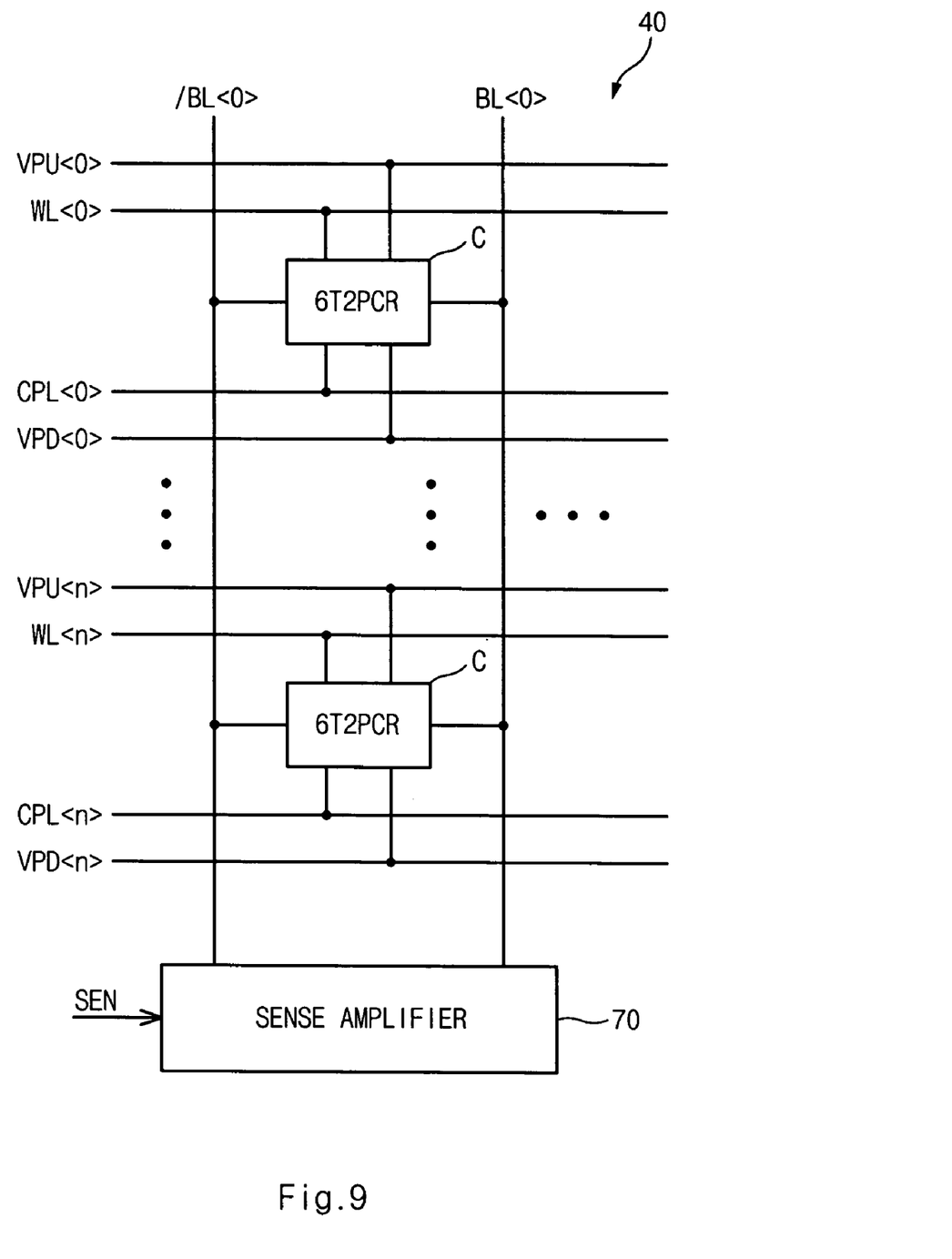
FIGS. 9 and 10 are diagrams illustrating examples of a PCR cell array of FIG. 7.

FIG. 9 is a diagram illustrating the PCR cell array 40 of FIG. 2.

The PCR cell array 40 comprises a plurality of power voltage terminals VPU<0>~VPU<n>, a plurality of word lines WL<0>~WL<n>, a plurality of cell plate lines CPL<0>~CPL<n> and a plurality of ground voltage terminals VPD<0>~VPD<n> which are arranged in a row direction, and a plurality of paired bit lines BL and /BL which are arranged in a column direction. Then, the phase change resistor cell C having a 6T2PCR structure as shown in FIG. 2 is located between the paired bit lines BL and /BL.

One phase change resistor cell C is located between the paired bit lines BL and /BL, and connected to the power voltage terminal VPU, the word line WL, the cell plate line CPL and the ground voltage terminal VPD.

One sense amplifier 70 is connected one by one to the paired bit lines BL and /BL. Each sense amplifier 70 is operated when the sense amplifier enable signal SEN is activated, and amplifies data applied from the paired bit lines BL and /BL.

Figure 10:
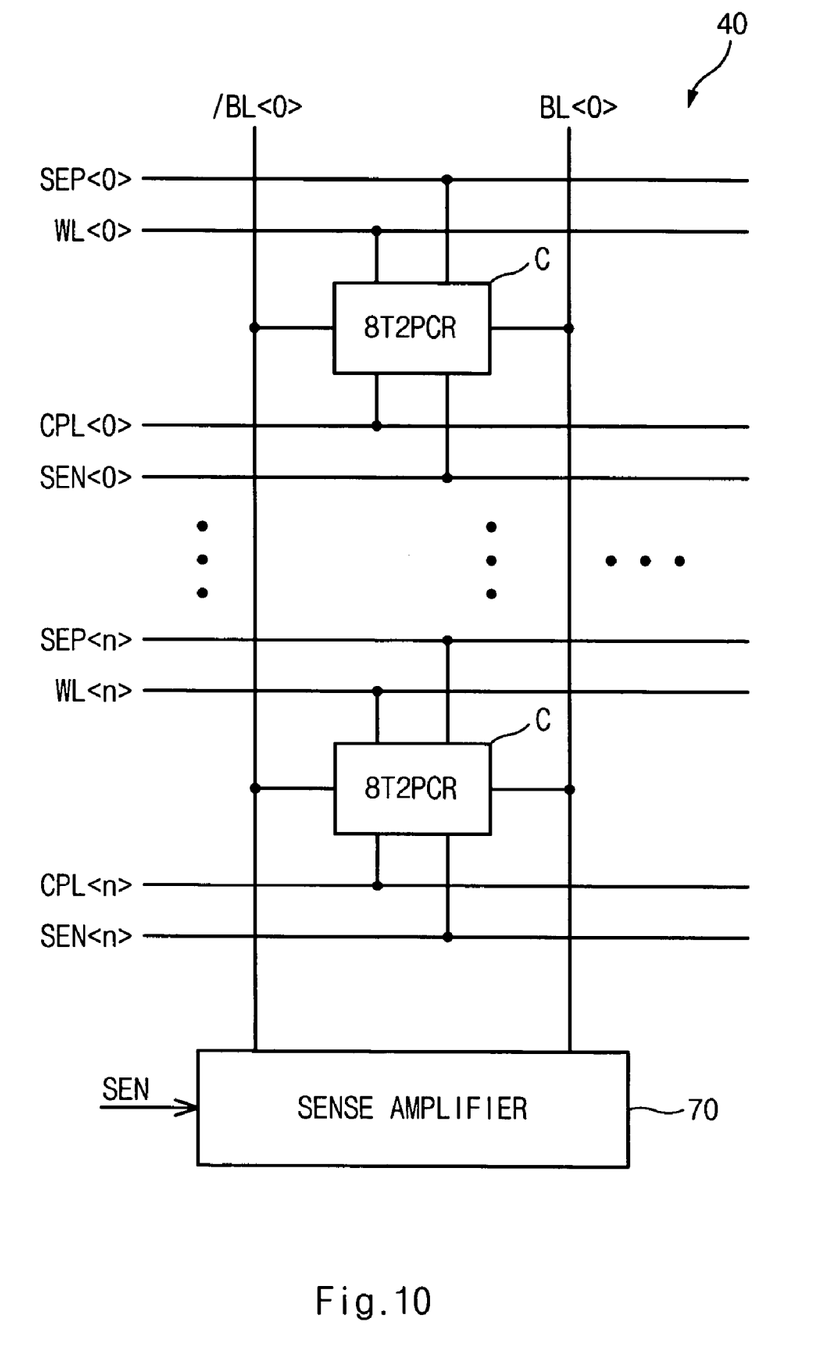

FIG. 10 is a diagram illustrating the PCR cell array 40 of FIG. 3.

The PCR cell array 40 comprises a plurality of sense amplifier enable signal terminals SEP<0>~SEP<n>, a plurality of word lines WL<0>~WL<n>, a plurality of cell plate lines CPL<0>~CPL<n> and a plurality of sense amplifier enable signal terminals SEN<0>~SEN<n> which are arranged in a row direction, and a plurality of paired bit lines BL and /BL which are arranged in a column direction. Then, the phase change resistor cell C having a 8T2PCR structure as shown in FIG. 3 is located between the paired bit lines BL and /BL.

One phase change resistor cell C is located between the paired bit lines BL and /BL, and connected to the word line WL and the cell plate line CPL. The operation of one phase change resistor cell C is controlled by the level of the sense amplifier enable signals SEP and SEN.

One sense amplifier 70 is connected one by one to the paired bit lines BL and /BL. Each sense amplifier 70 is operated when the sense amplifier enable signal SEN is activated, and amplifies data applied from the paired bit lines BL and /BL.

Figure 11:
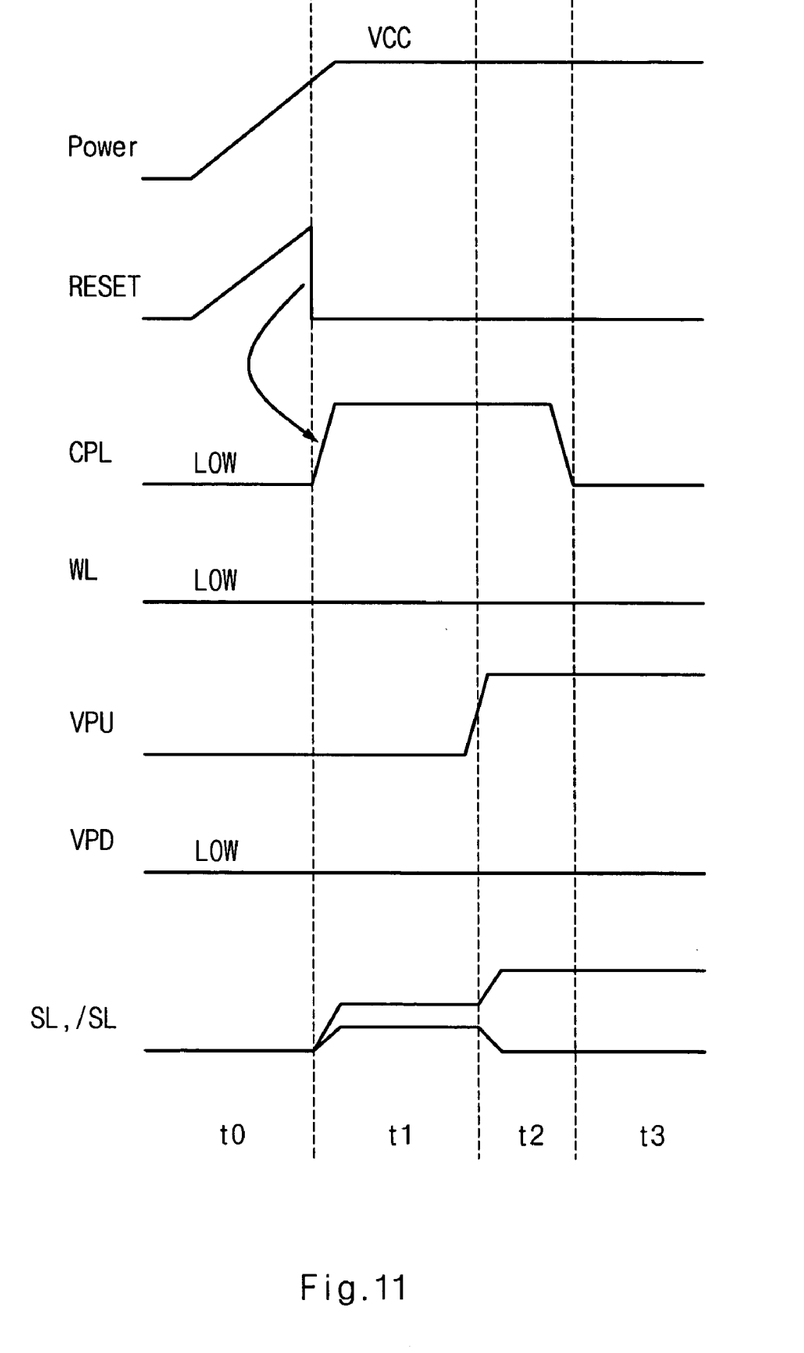
FIG. 11 is a timing diagram illustrating the power-up mode of the nonvolatile memory device using a phase change resistor cell according to an embodiment of the present invention.

FIG. 11 is a timing diagram illustrating the power-up mode of the nonvolatile memory device using a phase change resistor cell according to an embodiment of the present invention.

At the power-up mode, if a power voltage rises and a predetermined voltage level reaches a predetermined voltage level VCC in an interval t1, the power-up reset unit 100 generates the reset signal RESET. Then, if the cell plate line CPL transits to 'high', the PN diode switch 20 of the hybrid switch HSW1 or HSW2 is turned on. As a result, voltage levels of data stored in the phase change resistors PCR1 and PCR2 are applied to the nodes SL and /SL.

For example, when the phase change resistor PCR1 is used as large resistance and the phase change resistor PCR2 is used as small resistance, the voltage of the node SL is 'high' and the voltage of the node /SL is 'low'.

Thereafter, when an interval t2 starts, the power voltage VPU transits to 'high', the flip-flop unit 10 is operated so that the voltage levels of data applied to the node SL and /SL are amplified. When an interval t3 starts, the cell plate line CPL transits to 'low', the PN diode switch 20 of the hybrid switch HSW1 or HSW2 is turned off so that the power-up mode is completed. As a result, data applied from the phase change resistors PCR1 and PCR2 are stored in the flip-flop unit 10.

Here, the word line WL and the ground voltage terminal VPD are maintained at a low level in the power-up mode so that data of the bit lines BL and /BL may be prevented from being written in the flip-flop unit 10.

Figure 12:
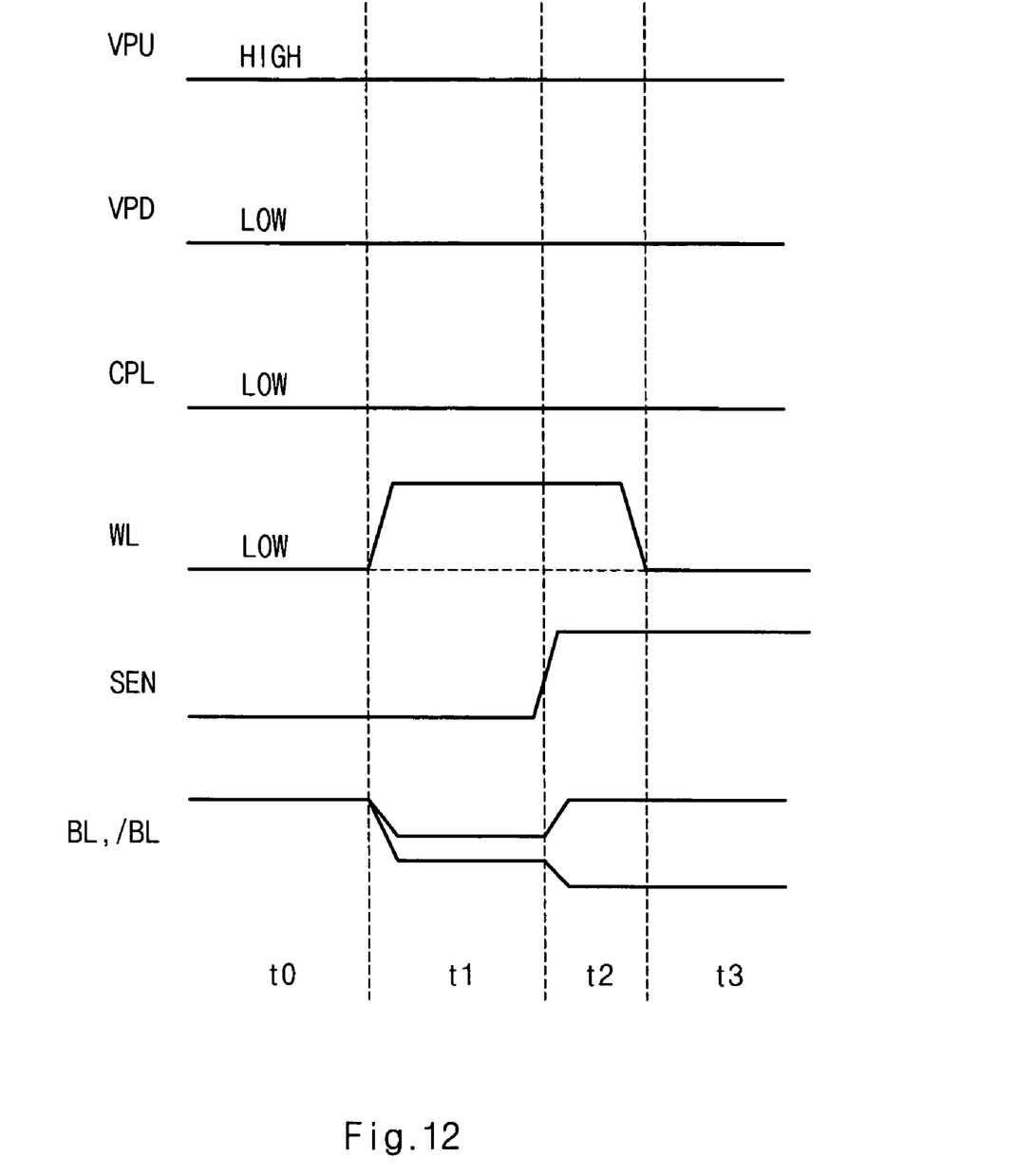
FIG. 12 is a timing diagram illustrating the write mode of the nonvolatile memory device using a phase change resistor cell according to an embodiment of the present invention.

FIG. 12 is a timing diagram illustrating the write mode of the nonvolatile memory device using a phase change resistor cell according to an embodiment of the present invention.

In the read mode, the power voltage terminal VPU is kept 'high', and the ground voltage terminal VPD and the cell plate line CPL are kept 'low'.

When an interval t1 starts, if the word line WL transits to 'high' and the NMOS transistors N3 and N4 are turned on. As a result, the flip-flop unit 10 connected to the bit lines BL and /BL outputs data read from the nodes SL and /SL to the bit lines BL and /BL.

Next, when an interval t2 starts, if the sense amplifier enable signal SEN transits to 'high', the sense amplifier 70 is operated to amplify data applied to the bit lines BL and /BL.

Thereafter, when an interval t3 starts, if the word line transits to 'low', the flip-flop unit 10 is disconnected from the bit lines BL and /BL. As a result, the read operation is completed. Here, the PN diode switch 20 and the PNPN diode switch 21 of the hybrid switch HSW are kept off.

Figure 13:
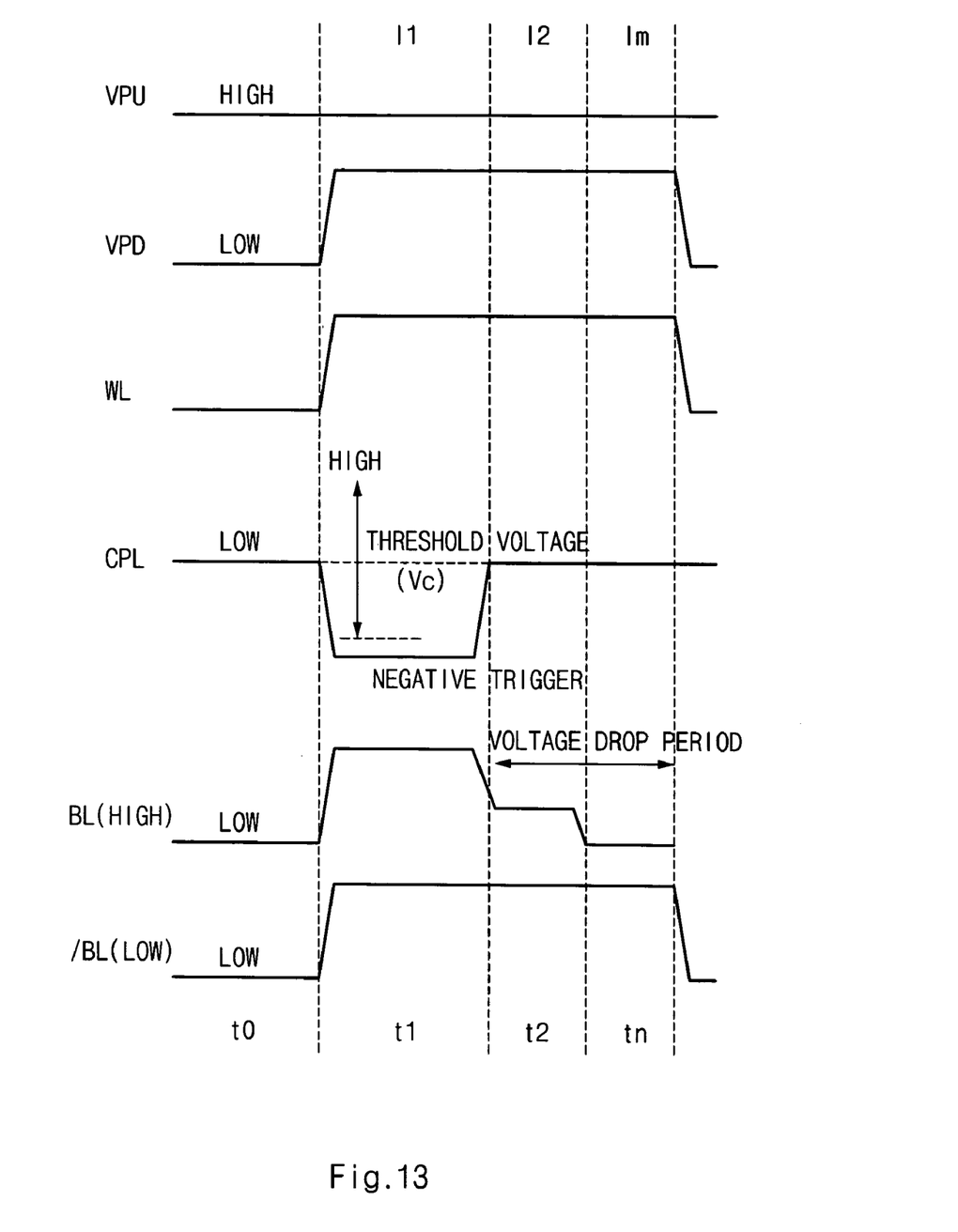
FIG. 13 is a diagram illustrating temperature characteristics of the phase change resistor cell in the write mode of the nonvolatile memory device suing a phase change resistor cell according to an embodiment of the present invention.

FIG. 13 is a diagram illustrating temperature characteristics of the phase change resistor cell in the write mode of the nonvolatile memory device suing a phase change resistor cell according to an embodiment of the present invention.

When an interval t1 starts, if the ground voltage terminal VPD transits to 'high', the operation of the flip-flop unit 10, illustrated in FIG. 3, stops so that both nodes SL and /SL become all 'high'. If the word line WL transits to 'high', the bit lines BL and /BL connected to the nodes SL and /SL become all at a high level.

Here, suppose that data applied to the bit line BL is 'high' and data applied to the bit line /BL is 'low'. At this sate, a voltage of the cell plate line CPL transits to a negative voltage which corresponds to a value of less than the threshold voltage Vc. That is, a difference between a low voltage level of the bit line BL and a negative voltage level of the cell plate line CPL does not reach to the level of the threshold voltage Vc to turn on the PNPN diode switch 21 of the hybrid switch HSW.

However, a voltage of over the threshold voltage Vc to turn on the PNPN diode switch 21 is applied to the hybrid switch HSW by a difference between a high amplifying voltage of the bit line BL and a negative voltage of the cell plate line CPL. As a result, the PNPN diode switch 21 is turned on to write data in the phase change resistors PCR1 and PCR2.

After PNPN diode switch 21 is turned on, a large amount of current I1 can flow although a small voltage Vs is applied to the phase change resistors PCR1 and PCR2 as shown in the operation characteristics of FIG. 6. As a result, the sufficient amount of current flows to write data in the PCR even when the voltage of the cell plate line CPL rises again from the negative voltage level to the low level after the interval t2.

Thereafter, during intervals t2~tn, different voltage drop levels are shown depending on patterns of data applied to the bit lines BL and /BL.

In other words, when the bit line BL having a high data value controls the voltage level of the bit line BL to drop step by step during the intervals t2~tn. On the other hand, when the bit line /BL having a data low value controls the voltage level of the bit line BL to be continuously at the high state during the intervals t2~tn.

The level of the voltage applied to the bit line BL is dropped step by step so that the melting temperature of the PCR, which is kept crystalline at the write mode, may be constantly maintained at a low temperature. Here, when the level of the voltage applied to the bit line BL is constantly maintained without being dropped, the temperature of the phase change resistor PCR1 rises so that the crystalline phase change resistor PCR1 changes into the amorphous phase change resistor PCR1. Therefore, the level of the voltage applied to the bit line BL is dropped step by step so that the crystalline temperature may be maintained.

On the other hand, the level of the voltage applied to the bit line /BL is constantly maintained so that the melting temperature of the phase change resistor PCR2, which is kept amorphous, may rise. That is, as the melting temperature increases, characteristics of the amorphous phase change resistor PCR2 are improved. As a result, when a predetermined voltage is applied to the bit line /BL, the temperature rises so that the amorphous state is continuously maintained.

Here, a restoration operation is not required because data are stored in the PCR having a nonvolatile characteristic.

As discussed earlier, a nonvolatile memory device using a phase change resistor cell according to an embodiment of the present invention provides the following effects: to provide a high-speed SRAM having rapid memory operation characteristics with a phase change resistor and a hybrid switch which does not require an additional gate control signal; to reduce the whole size of a nonvolatile ferroelectric memory by embodying a cross-point cell with a hybrid switch which does not require an additional gate control signal; and to improve operating characteristics of a memory cell by effectively driving read/write operations in a cell array comprising the phase change resistor and the hybrid switch.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A phase change resistor cell comprising:
    a plurality of phase change resistors for storing at least one or more of data corresponding to a crystallization state changed by current applied from a cell plate line;
    a plurality of hybrid switches connected one by one to the plurality of phase change resistors, and selectively switched depending on voltages applied to the cell plate line and a bit line; and
    a storage means, connected to the plurality of hybrid switches, for storing different nonvolatile data through input/output terminals.

2. The phase change resistor cell according to claim 1, wherein each of the plurality of hybrid switches is switched when a voltage applied to the cell plate line is a first voltage at a power-up mode, and outputs data stored in the plurality of phase change resistors to the storage means.

3. The phase change resistor cell according to claim 2, wherein each of the plurality of hybrid switches is switched when a voltage applied to the cell plate line is a negative trigger voltage lower than the first voltage by a threshold voltage at a write mode, and outputs data applied from the bit line to the plurality of phase change resistors.

4. The phase change resistor cell according to claim 3, wherein after the negative trigger voltage is applied, a voltage level of the bit line drops step by step when data of the bit line are at a high level, and a voltage level of the bit line is constantly maintained when data of the bit line is at a low level.

5. The phase change resistor cell according to claim 1, further comprising an access regulating unit for controlling connection between the bit line and the storage means depending on a voltage level of a word line.

6. The phase change resistor cell according to claim 5, wherein the access regulating unit comprises:
    a first driving unit for controlling connection between a bit line and a first node of the storage means depending on the level of the voltage applied to the word line; and a second driving unit for controlling connection between a bit line bar and a second node of the storage means depending on the level of the voltage applied to the word line.

7. The phase change resistor cell according to claim 1, wherein each of the plurality of hybrid switches comprises a PN diode switch and a PNPN diode switch which are connected in parallel between the plurality of phase change resistors and the storage means.

8. The phase change resistor cell according to claim 7, wherein the PN diode switch consists of a P-type region connected to the phase change resistor and a N-type region connected to the storage means.

9. The phase change resistor cell according to claim 7, wherein the PNPN diode switch consists of an upper N-type region connected to the phase change resistor and a lower P-type region connected to the storage means.

10. The phase change resistor cell according to claim 1, wherein the storage means is flip-flop unit.

11. The phase change resistor cell according to claim 10, wherein the flip-flop unit comprises:
a PMOS latch located between a power voltage terminal and the input/output terminals to have a cross-coupled structure; and
a NMOS latch located between a ground voltage terminal and the input/output terminals to have a cross-coupled structure.

12. The phase change resistor cell according to claim 11, wherein the flip-flop unit comprises:
a third driving unit, connected between the power voltage terminal and the flip-flop unit, having a gate to receive a first sense amplifier enable signal; and
a fourth driving unit, connected between the ground voltage terminal and the flip-flop unit, having a gate to a second sense amplifier enable signal having an opposite phase to that of the first sense amplifier enable signal.

13. A nonvolatile memory device using a phase change resistor cell, comprising:
a plurality of phase change resistor cell arrays each comprising a plurality of unit phase change resistor cells arranged in row and column directions; and
a plurality of sense amplifiers for sensing and amplifying data applied from the plurality of phase change resistor cell arrays,
wherein each of the plurality of unit phase change resistor cells comprises:
a plurality of phase change resistors for storing at least one or more of data corresponding to a crystallization state changed by current applied from a cell plate line;
a plurality of hybrid switches connected one by one to the plurality of phase change resistors, and selectively switched depending on voltages applied to the cell plate line and a bit line; and
a storage means, connected to the plurality of hybrid switches, for storing different nonvolatile data through nodes of both terminals.

14. The nonvolatile memory device according to claim 13, further comprising:
a plurality of word line driving units for selectively driving word lines of the plurality of phase change resistor cell arrays;
a plurality of cell plate line driving units for selectively driving cell plate lines of the plurality of phase change resistor cell arrays;
a data bus shared by the plurality of sense amplifiers;
a data buffer for buffering data applied from the data bus; and
an input/output port for externally outputting output data applied from the data buffer or applying input data applied externally to the data buffer.

15. The nonvolatile memory device according to claim 13, wherein each of the plurality of phase change resistor cell arrays further comprises:
a power-up reset unit for outputting a reset signal for initializing the plurality of phase change resistor cell arrays;
a read/write control unit for outputting control signals for reading/writing data in the plurality of phase change resistor cell arrays; and
a phase change resistor cell control unit for controlling read/write operations of the phase change resistor cell array in response to the reset signal and the control signals.

16. The nonvolatile memory device according to claim 13, wherein each of the phase change resistor cells is located where a plurality of word lines, a plurality of cell plate lines, a power voltage terminal and a ground voltage terminal which are arranged in a row direction are crossed with a pair of bit lines which are arranged in a column direction.

17. The nonvolatile memory device according to claim 13, wherein each of the plurality of unit phase change resistor cells is located where a plurality of word lines, a plurality of cell plate lines, a plurality of sense amplifier enable signal terminals which are arranged in a row direction are crossed with a pair of bit lines which are arranged in a column direction.

18. The nonvolatile memory device according to claim 13, wherein each of the plurality of sense amplifiers is connected to the paired bit lines, and amplifies a voltage applied from the paired bit lines when a sense amplifier enable signal is activated.

19. The nonvolatile memory device according to claim 13, wherein the unit phase change resistor cell further comprises an access regulating unit for controlling connection between the bit line and the storage means depending on a level of a voltage applied to a word line.

20. The nonvolatile memory device according to claim 13, wherein each of the plurality of hybrid switches comprises a PN diode switch and a PNPN diode switch which are connected in parallel between the plurality of phase change resistors and the storage means.

21. The nonvolatile memory device according to claim 20, wherein the PN diode switch consists of a P-type region connected to the phase change resistor and a N-type region connected to the storage means.

22. The nonvolatile memory device according to claim 20, wherein the PNPN diode switch consists of an upper N-type region connected to the phase change resistor and a lower P-type region connected to the storage means.

* * * * *